United States Patent
Mitchell et al.

(10) Patent No.: US 10,282,899 B2
(45) Date of Patent: May 7, 2019

(54) SYSTEMS, METHODS AND, MEDIA FOR SIMULATING DEFORMATIONS OF NONLINEAR ELASTIC BODIES

(71) Applicant: Wisconsin Alumni Research Foundation, Madison, WI (US)

(72) Inventors: Nathan M. Mitchell, Madison, WI (US); Eftychios D. Sifakis, Verona, WI (US); Michael S. Doescher, Madison, WI (US)

(73) Assignee: Wisconsin Alumni Research Foundation, Madison, WI (US)

(*) Notice: Subject to any disclaimer, the term of this patent is extended or adjusted under 35 U.S.C. 154(b) by 0 days.

(21) Appl. No.: 15/645,770

(22) Filed: Jul. 10, 2017

(65) Prior Publication Data

US 2019/0012831 A1   Jan. 10, 2019

(51) Int. Cl.
G06T 15/00 (2011.01)
G06T 17/20 (2006.01)
G06T 19/20 (2011.01)

(52) U.S. Cl.
CPC .......... *G06T 17/205* (2013.01); *G06T 15/005* (2013.01); *G06T 19/20* (2013.01); *G06T 2215/16* (2013.01); *G06T 2219/2021* (2013.01)

(58) Field of Classification Search
CPC . G06T 2219/2021; G06T 15/00; G06T 17/00; G06T 17/20; G06T 19/00; G06F 17/5018
See application file for complete search history.

(56) References Cited

PUBLICATIONS

Terzopoulos et al., Elastically Deformable Models, Computer Graphics, vol. 21, No. 4, Jul. 1987, pp. 205-214.*
Hauptmann et al., A Systematic Development of 'Solid-Shell' Element Formulations for Linear and Non-Linear Analyses Employing Only Displacement Degrees of Freedom, International Journal for Numerical Methods in Engineering, 42, 1998, pp. 49-69.*

(Continued)

*Primary Examiner* — Haixia Du
(74) *Attorney, Agent, or Firm* — Quarles & Brady LLP

(57) ABSTRACT

In accordance with some embodiments, systems, methods and media for simulating deformation of an elastic body are provided. In some embodiments, a method comprises: determining for each macroblock, a stiffness matrix $K_i$ of a portion of a model of a non-linear elastic solid partitioned into cells; converting $K_i$ into block form to include a submatrix $K_{I_iI_i}$ for nodes between internal cells of a first macroblock; determining at least a portion of $K_{I_iI_i}^{-1}$; receiving input corresponding to force applied to cells of the model; determining displacements of exterior nodes of the first macroblock using the input and the portion of $K_{I_iI_i}^{-1}$; determining displacements of interior nodes of the first macroblock using the input and the displacements of exterior nodes; determining updated positions of the cells based on the displacements of the exterior nodes; and, causing the model to be presented using the updated positions.

24 Claims, 4 Drawing Sheets

(56) References Cited

PUBLICATIONS

Irving et al. "Invertible Finite Elements for Robust Simulation of Large Deformation," SCA 2004, 131-140, Eurographics Association.

Bouaziz et al., Projective dynamics: Fusing constraint projections for fast simulation, ACM Trans. Graph., Jul. 2014, 154:1-154:11, vol. 33, United States.

Dick et al., A hexahedral multigrid approach for simulating cuts in deformable objects, IEEE Transactions on Visualization and Computer Graphics, 2011, 1663-1675, vol. 17, IEEE, United States.

Ferstl et al., Large-scale liquid simulation on adaptive hexahedral grids, IEEE Trans. Visualization and Computer Graphics, Oct. 2014, 1405-1417, vol. 20, IEEE, United States.

Gao et al., Steklov-Poincare skinning, Eurographics ACM SIGGRAPH Symposium on Computer Animation, 2014, Eurographics Association.

Georgii et al., Corotated finite elements made fast and stable, VRIPHYS, 2008, Eurographics Association.

Hecht et al., Updated sparse Cholesky factors for corotational elastodynamics, ACM Trans. On Graph., 2012, vol. 31, United States.

Joshi et al., Harmonic coordinates for character articulation, ACM Trans. Graph, Jul. 2007, vol. 26, United States.

James et al., ArtDefo: accurate real time deformable objects, In Proceedings of ISGGRAPH, 1999, p. 65-72, vol. 99, United States.

Kavan et al., Geometric skinning with approximate dual quantemion blending, ACM Trans. Graph., Nov. 2008, 105:1-105:23, vol. 27, United States.

Mitchell et al., GRIDiron: An interactive authoring and cognitive training foundation for reconstructive plastic procedures, ACM Trans. Graph, 2015, United States.

Muller et al., Position based dynamics, Journal of Visual Communication and Image Representation, 2007, 109-118, vol. 18, United States.

Muller et al., Physically-based simulation of objects represented by surface meshes, CGI, 2004, 156-165, United States.

McAdams et al., Efficient elasticity for character skinning with contact collisions, ACM Trans. Graph., Jul. 2011, 37:1-37:12, vol. 30, United States.

Nesme et aL, Animating shapes at arbitrary resolution with non-uniform stiffness, VRIPHYS, 2006, Eurographics.

O'Brien et al., Graphical modeling and animation of brittle fracture, In Proc. of SIGGRAPH, 1999, 137-146, United States.

Patterson et al., Simulation of complex nonlinear elastic bodies using lattice deformers, ACM Trans. Graph., Nov. 2012, 197:1-197:10, vol. 31, United States.

Quarteroni et al., Domain decomposition methods for partial differential equations, 1000, vol. 10, Clarendon Press 1999 Front Cover and Table of Contents, 5 pages.

Rivers et al., FastLSM: Fast lattice shape matching for robust real-time deformation, ACM Trans. On Graphics, 2007, vol. 26, SIGGRAPH Proc., United States.

Sifakis et al., FEM simulation of 3D deformable solids: A practitioner's guide to theory, discretization and model reduction, ACM SIG. 2012 Courses, 2012, 20:1-20:50, SIGGRAPH, United States.

Sin et al., Vega: Non-linear fern deformable object simulator, Comput. Graph. Forum, 2013, 36-48, vol. 32, United States.

Teran et al., Finite volume methods for the simulation of skeletal muscle, SGA, 2003, 68-74, United States.

Terzopoulos et al., Elastically deformable models, SIGGRAPH Comput. Graph, Aug. 1987, 205-214, vol. 21, United States.

Villant et al., Implicit skinning: Real-time skin deformation with contact modeling, ACM Trans. Grapph., Jul. 2013, 125:1-125:12, vol. 32., United States.

Wang et al., A Chebyshev semi-iterative approach for accelerating projective and position-based dynamics, ACM Trans. Graph., Oct. 2015, 246:1-246:9, vol. 34, United States.

Zhu et al., An efficient multigrid method for the simulation of high-resolution elastic solids, ACM Trans. Graph., Apr. 2010, 16:1-16:18, vol. 29, United States.

\* cited by examiner

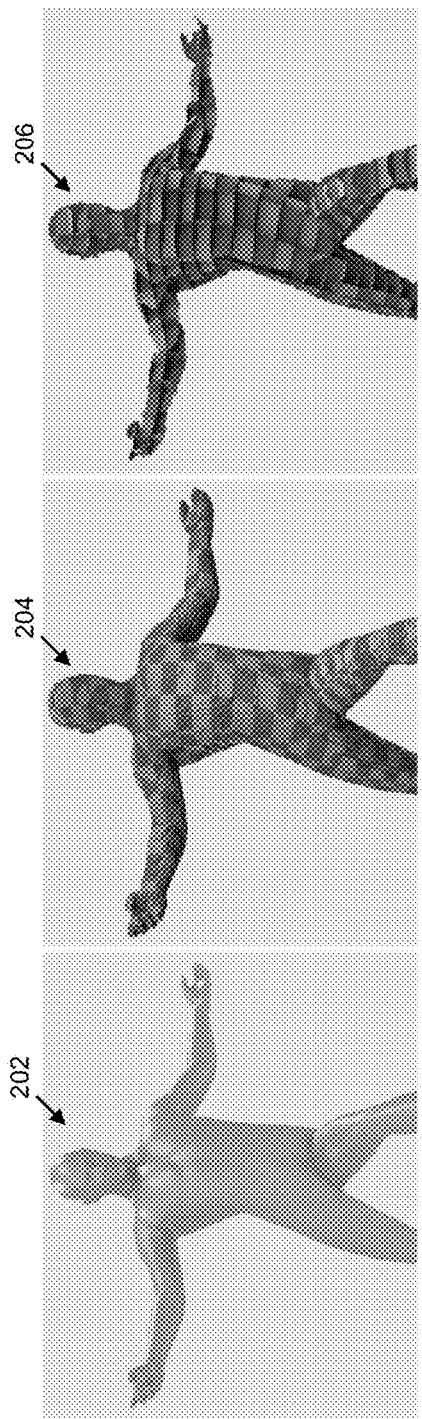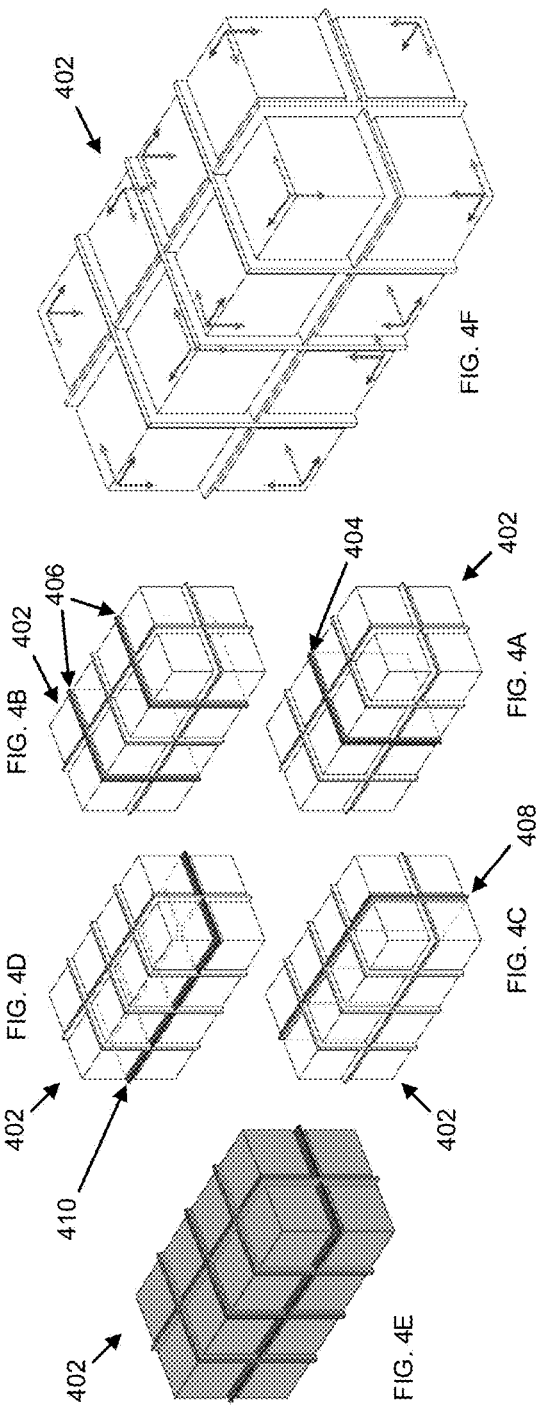

SYSTEMS, METHODS AND, MEDIA FOR SIMULATING DEFORMATIONS OF NONLINEAR ELASTIC BODIES

STATEMENT REGARDING FEDERALLY SPONSORED RESEARCH

This invention was made with government support under IIS1253598 and IIS1407282 awarded by the National Science Foundation. The government has certain rights in the invention.

CROSS-REFERENCE TO RELATED APPLICATIONS

N/A

BACKGROUND

Simulating the behavior of systems that include elastic materials undergoing relatively large deformations (e.g., due to a collision with a rigid body) often involves complex matrix algebra or iterative schemes that often do not efficiently provide an accurate solution within a time frame that would allow for interactive simulations.

For example, the Newton method, and various variations, are often used for simulating nonlinear elastic bodies, such as nonlinear multigrid cycles, projective and position-based dynamics, and shape matching. In a typical Newton scheme, once a linear approximation to the governing equations is computed, the solution to the resulting system is determined using either a direct method or a technique selected from a spectrum of iterative methods.

Direct solvers are typically a fairly straightforward way to solve the system that results from the linearization of the governing equations using a Newton scheme, and can be practical for relatively small problems when direct algebra is not very computational and/or memory intensive. Such direct solvers are often relatively resilient to the conditioning of the underlying problem. Additionally, techniques for directly solving such systems of equations for even relatively large models are available, such as high quality parallel implementations using the Intel MKL PARDISO library. However, such direct solvers typically exhibit super-linear increases in computational complexity as the complexity of the model and/or deformation increases. Even with the benefit of parallelism, such direct solving techniques typically take more time than several iterative schemes, especially if relatively few number of iterations are required to be performed to approximate the solution. Direct solving are also typically limited by the time it takes to access memory to store and retrieve the data used. For example, at the core of many direct solvers are forward and backward substitution routines that carry out a very small number of arithmetic operations for each memory access that is required. This often results in grossly memory-bound execution profiles on modern hardware in which the limiting factor is the time it takes to read to, and write from, memory rather than the time it takes to perform the calculations. This is exacerbated for large models that cannot be fit in cache memory of the processor. Further, each iteration of the Newton method is inherently inexact, providing only a step towards a converged solution. That is, using direct solving techniques often results in perfectly solving an inaccurate linearized approximation of the ultimate solution that is sought.

By contrast, using iterative solving techniques, an approximate solution to the linearized problem can be sought with the understanding that with each Newton iteration the problem itself will often change. For example, such iterative solving techniques can include Krylov methods such as Conjugate Gradient (CG), Multigrid, and fixed-point iterations such as Jacobi, Gauss-Seidel (GS), and successive over-relaxation (SOR). The primary benefit of such iterative techniques is that often each individual iteration can be performed relatively quickly, which can allow a user the option to either iterate as much as they can afford in a given time, or alternatively truncate the iterative process when the approximate solution is acceptable (e.g., each iteration is producing a solution that changes less than a threshold amount from the previous iteration). Additionally, many iterative solving techniques are assembly-free, alleviating the need to construct or store a stiffness matrix. In fact, some of the most efficient techniques go to great lengths to minimize memory footprint while leveraging single instruction, multiple data (SIMD) and multithreading techniques.

However, iterative solving techniques often have different challenges. For example, local techniques such as Jacobi, GS, and SOR are slow to capture global effects, as they propagate information at a limited speed across the mesh of a model. As another example, many Krylov methods prioritize the most important modes that contribute to a high residual. In a more particular example, considering a system with a few tangled elements that create large local forces, elements suffering from small errors will be relatively neglected by a technique such as Conjugate Gradients, while the solver focuses computational resources on the highly tangled elements before resolving the bigger picture. While multigrid often has performance advantages, it can be relatively difficult to configure to work robustly, and might be less appropriate for certain types of objects such as thin elastic objects (e.g., a thin flesh layer on a simulated face). Preconditioning can accelerate the convergence of iterative solvers, but—in contrast to certain fluids simulation scenarios—the accelerated convergence may not justify the increased per-iteration cost. Preconditioners based on incomplete factorizations are typically memory bound as they require matrix assembly, and generally require an expensive re-factorization at each Newton iteration. Further, the same factorization overhead is incurred in each Newton iteration regardless of how closely the Newton method is to convergence. For example, in a case where the Newton method is nearly converged such that just a handful of iterations would suffice to solve the linearized equations, the same factorization overhead is incurred which can contribute a relatively large portion of the total time to solve the linearized equations. Multigrid-based preconditioners can achieve more competitive performance in some circumstances, and have been primarily explored in the area of fluid simulation rather than in the simulation of nonlinear deformable solids.

When fidelity and realism of the simulation is a goal, physics-based methods are often employed, such as the Finite Element Method, which has been used to animate a diverse spectrum of behaviors. Grid-based, embedded elastic models have also been used frequently due to their potential for performance optimizations, and can also be used with shape-matching approaches. Such grid-based models form the foundation for a class of relatively efficient, multigrid-based numerical solution techniques. Various techniques to accelerate simulation performance have been proposed. For example, using optimized direct solvers, delayed updates to factorization approaches, leveraging the Boundary Element Method to approach real-time deformation, and similar formulations that abstract away interior degrees of freedom to accelerate collision processing. However, while the techniques described above may improve performance, they may suffer from significant disadvantages, such as being limited by memory access, superlinear increases in complexity with model size, delays in capturing global effects, etc.

Accordingly, new systems, methods and, media for simulating deformations of nonlinear elastic bodies are desirable.

SUMMARY

In accordance with some embodiments of the disclosed subject matter, systems, methods, and media for simulating deformations of nonlinear elastic bodies.

In accordance with some embodiments of the disclosed subject matter, method for simulating deformation of an elastic body is provided, the method comprising: determining, using a hardware processor, for each of a plurality of macroblocks, a stiffness matrix $K_i$ corresponding to at least a portion of a model of a non-linear elastic solid that is partitioned into a plurality of cells, wherein entries in the stiffness matrix correspond to nodes between cells; converting, for a first macroblock of the plurality of macroblocks, the stiffness matrix $K_i$ into block form to include a submatrix $K_{I_iI_i}$ corresponding to nodes between internal cells of the macroblock; determining, for the first macroblock, at least a portion of inverse matrix $K_{I_iI_i}^{-1}$ of the submatrix $K_{I_iI_i}$; receiving input data corresponding to force applied to one or more nodes of the plurality of cells; determining, for the first macroblock, displacements of nodes that are on the exterior of the macroblock based at least in part on the input data and the portion of the matrix $K_{I_iI_i}^{-1}$; determining, for the first macroblock, displacements of nodes that are interior to the macroblock based at least in part on the input data and the displacements of nodes that are on the exterior of the macroblock; determining updated positions of the cells of the model based at least in part on the displacements of nodes that are on the exterior of the macroblocks; and causing the model to be presented on a display device using the updated positions.

In accordance with some embodiments of the disclosed subject matter, a system for simulating deformation of an elastic body is provided, the system comprising: memory storing a model of a non-linear elastic solid; a display device; a hardware processor that is coupled to the memory and the display device, and is programmed to; determine, using a hardware processor, for each of a plurality of macroblocks, a stiffness matrix $K_i$ corresponding to at least a portion of the model that is partitioned into a plurality of cells, wherein entries in the stiffness matrix correspond to nodes between cells; convert, for a first macroblock of the plurality of macroblocks, the stiffness matrix $K_i$ into block form to include a submatrix $K_{I_iI_i}$ corresponding to nodes between internal cells of the macroblock; determining, for the first macroblock, at least a portion of inverse matrix $K_{I_iI_i}^{-1}$ of the submatrix $K_{I_iI_i}$; receive input data corresponding to force applied to one or more nodes of the plurality of cells; determine, for the first macroblock, displacements of nodes that are on the exterior of the macroblock based at least in part on the input data and the portion of the matrix $K_{I_iI_i}^{-1}$; determine, for the first macroblock, displacements of nodes that are interior to the macroblock based at least in part on the input data and the displacements of nodes that are on the exterior of the macroblock; determine updated positions of the cells of the model based at least in part on the displacements of nodes that are on the exterior of the macroblocks; and cause the model to be presented on the display device using the updated positions.

In accordance with some embodiments of the disclosed subject matter, a non-transitory computer readable medium containing computer executable instructions that, when executed by a processor, cause the processor to perform a method for simulating deformation of an elastic body is provided, the method comprising: determining for each of a plurality of macroblocks, a stiffness matrix $K_i$ corresponding to at least a portion of a model of a non-linear elastic solid that is partitioned into a plurality of cells, wherein entries in the stiffness matrix correspond to nodes between cells; converting, for a first macroblock of the plurality of macroblocks, the stiffness matrix $K_i$ into block form to include a submatrix $K_{I_iI_i}$ corresponding to nodes between internal cells of the macroblock; determining, for the first macroblock, at least a portion of inverse matrix $K_{I_iI_i}^{-1}$ of the submatrix $K_{I_iI_i}$; receiving input data corresponding to force applied to one or more nodes of the plurality of cells; determining, for the first macroblock, displacements of nodes that are on the exterior of the macroblock based at least in part on the input data and the portion of the matrix $K_{I_iI_i}^{-1}$; determining, for the first macroblock, displacements of nodes that are interior to the macroblock based at least in part on the input data and the displacements of nodes that are on the exterior of the macroblock; determining updated positions of the cells of the model based at least in part on the displacements of nodes that are on the exterior of the macroblocks; and causing the model to be presented on a display device using the updated positions.

In some embodiments, each of the plurality of macroblocks are 16×8×8 grid cells and comprise 15×7×7 internal cells, wherein submatrix $K_{I_iI_i}$ only includes entries for nodes between two internal cells.

In some embodiments, determining at least the portion of the inverse matrix $K_{I_iI_i}^{-1}$ further comprises: partitioning the 15×7×7 internal cells into sixteen 3×3×3 subdomains and five interface layers, wherein a first interface layer represents a 1×7×7 layer of cells that separates the 15×7×7 internal cells into a first 7×7×7 subdomain and a second 7×7×7 subdomain; generating a block form of the submatrix $K_{I_iI_i}$ by reordering the submatrix $K_{I_iI_i}$ into a first submatrix $K_{11}$ corresponding to entries representing nodes between cells in the first subdomain, a second submatrix $K_{22}$ corresponding to entries representing nodes between cells in the second subdomain, a third submatrix $K_{cc}$ corresponding to entries representing nodes between cells in the first interface layer, and a plurality of submatrices $K_{1c}$, $K_{2c}$, $K_{c1}$, and $K_{c2}$ corresponding to entries representing nodes between the first subdomain, the second domain and the first interface layer; generating at least a portion of the inverse of the block form of the submatrix $K_{I_iI_i}$ by converting the block form of the submatrix $K_{I_iI_i}$ to a block-LDL form:

$$\begin{pmatrix} I & 0 & -K_{11}^{-1}K_{1c} \\ 0 & I & -K_{22}^{-1}K_{2c} \\ 0 & 0 & I \end{pmatrix} \begin{pmatrix} K_{11}^{-1} & 0 & 0 \\ 0 & K_{22}^{-1} & 0 \\ 0 & 0 & C \end{pmatrix} \begin{pmatrix} I & 0 & 0 \\ 0 & I & 0 \\ -K_{c1}K_{11}^{-1} & -K_{c2}K_{22}^{-1} & I \end{pmatrix}$$

where $C = K_{cc} - K_{c1}K_{11}^{-1}K_{1c} - K_{c2}K_{22}^{-1}K_{2c}$, and is the Shur complement of $K_{cc}$; determining, for each 3×3×3 subdomain, an inverse $K_{jj}^{-1}$ of a submatrix $K_{jj}$ corresponding to entries representing nodes between cells in that 3×3×3 subdomain; determining $K_{11}^{-1}$ based on each inverse $K_{jj}^{-1}$ that corresponds to a 3×3×3 subdomain included within the first subdomain; determining $K_{22}^{-1}$ based on each inverse $K_{jj}^{-1}$ that corresponds to a 3×3×3 subdomain included within the second subdomain; and storing at least the portion of the $K_{I_iI_i}^{-1}$ in cache memory of the hardware processor.

In some embodiments, inverting the submatrix $K_{jj}$ further comprises: determining Cholesky factors for the submatrix $K_{jj}$; and determining the inverse $K_{jj}^{-1}$ using the Cholesky factors and forward and backward substitution.

In some embodiments, the method further comprises inverting the submatrices $K_{jj}$ corresponding to the sixteen 3×3×3 subdomains in parallel.

In some embodiments, the method further comprises determining at least the portion of the inverse matrix $K_{I_iI_i}^{-1}$ corresponding to each of the plurality of macroblocks, including the portion of the matrix $K_{I_iI_i}^{-1}$ corresponding the first macroblock, in parallel.

In some embodiments, determining displacements of nodes that on the exterior of the first macroblock based at least in part on the input data and at least the portion of the matrix $K_{I_iI_i}^{-1}$ further comprises using a Conjugate Gradient-based iterative solver.

In some embodiments, the method further comprises: determining, for each of a second plurality of macroblocks that each overlap a boundary of the model, a stiffness matrix $K_i$ corresponding to at least a portion of the model of a non-linear elastic solid, wherein each macroblock of the second plurality of macroblocks includes less cells of the model than the size of the macroblocks of the plurality of macroblocks; and setting, for each of the second plurality of macroblocks, entries in the stiffness matrix $K_i$ that correspond to nodes in the macroblock that are exterior to the model to a zero-Dirichlet condition.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements.

FIG. 2 shows an example of a model in accordance with some embodiments of the disclosed subject matter.

FIGS. 4A-4F show examples of subdividing a macroblock into smaller sets of nodes in accordance with some embodiments of the disclosed subject matter.

DETAILED DESCRIPTION

Figure 1:
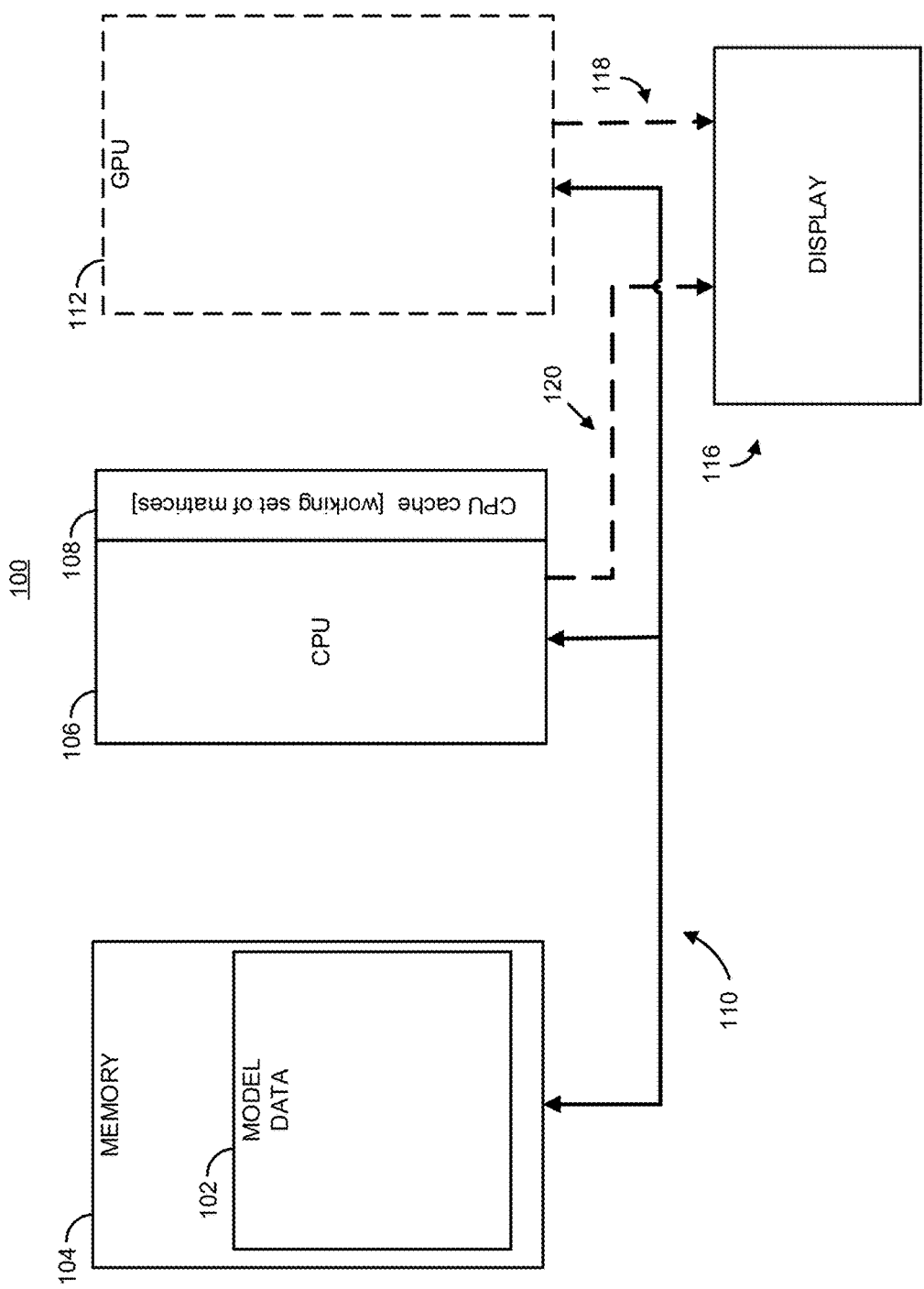
FIG. 1 shows an example of a system for simulating deformations of nonlinear elastic bodies in accordance with some embodiments of the disclosed subject matter.

In accordance with various embodiments, mechanisms (which can, for example, include systems, methods, and media) for simulating deformations of nonlinear elastic bodies are provided.

In some embodiments, the mechanisms described herein can facilitate simulation of a collision between a non-linear elastic body (e.g., one or more portions of a human figure, a thin volumetric sheet, a model of a complex character, etc.). In some embodiments, the mechanisms described herein can use a hybrid technique that balances certain advantages of both direct and iterative solving schemes. In some embodiments, such a hybrid technique may facilitate a compromise between memory load and compute load, while significantly reducing iteration count. For example, by reducing the memory footprint required to simulate a particular interaction using the mechanisms described herein.

In some embodiments, a model can be subdivided into cells (e.g., cubes) that each has one or more properties describing how the cell behaves in connection with neighboring cells. The properties of the cell can, for example, reflect the material being simulated by the model at the location of the cell. In a more particular example, different cells can simulate muscle, skin, bone, etc. As another example, properties of a cell can reflect multiple materials being simulated by the model that fall within the cell (e.g., by combining stiffness matrices corresponding to each material to determine a combined stiffness matrix for the cell). In some embodiments, the properties of each cell can be metadata associated with the model, or can be calculated from the data representing the model itself. In some embodiments, the mechanisms described herein can use a grid-based discretization, and aggregate rectangular clusters of cells into "macroblocks." For example, a macroblock can be a cluster of up to 16×8×8 neighboring cells (note that a macroblock can have less cells where it includes a void or other empty space). In some embodiments, macroblocks can essentially act as composite elements in a similar way that a hexahedral element can be considered a black box that takes displacements as inputs and produces nodal forces as output. However, the composite elements described herein take in displacements on the nodes of their periphery and return forces on those same boundary nodes. In some embodiments, using macroblocks can facilitate representing the nonlinear elastic model using an equivalent linear system with degrees of freedom only on boundaries of the macroblock.

In some embodiments, the mechanisms described herein can be used in connection with a Newton-type scheme for solving a nonlinear system of governing equations. Although the mechanisms described herein are disclosed as being used in connection with grid-based discretizations of elasticity, the mechanisms can be used with other simulation paradigms (e.g., multigrid, projective dynamics).

The governing equations describing the deformation of an elastic nonlinear solid typically depend on the time integration scheme employed. For example, quasistatic simulation can involve solving the nonlinear equilibrium equation f(x; t)=0 at any time instance t. Using an initial guess $x^{(k)}$ of the solution, Newton's method is used to compute a correction $\delta x = x^{(k+1)} - x^{(k)}$ by solving the linearized system:

$$\underbrace{-\partial f / \partial x |_{x^{(k)}}}_{K(x^{(k)})} \cdot \delta x = f(x^{(k)}), \qquad (1)$$

In some embodiments, if an implicit Backward Euler scheme is used, a system with similar structure forms a portion of Newton's method:

$$\left[ \left(1 + \frac{\gamma}{\Delta t}\right) K(x^{(k)}) + \frac{1}{\Delta t^2} M \right] \delta x = \frac{1}{\Delta t} M(v^p - v^{(k)}) + f(x^{(k)}, v^{(k)}), \qquad (2)$$

where M is the mass matrix, y is the Rayleigh coefficient, $v^p$ is the velocities at the previous time step, and f now includes both elastic and damping forces. Despite the semantic differences, the linear systems in Equations (1) and (2) are similar algebraically, in that: (i) their coefficient matrices are both symmetric positive definite; (ii) their coefficient matrices have the same sparsity pattern; and (iii) in a grid-based discretization, their coefficient matrices can be assembled from the contributions of individual grid cells. Note that, in order for the last property to hold, the mechanisms described herein assume that the elastic model does not have any interactions between remote parts of its domain, such as penalty forces used to enforce self-collision. However, penalty forces used to enforce collisions with external kinematic bodies are not excluded, since their point of application on the elastic body can be embedded in a single grid cell. The simplified notation Kx=f is used herein to represent any linear system that shares properties (i)-(iii) above, without individual emphasis on whether the system originated from a quasistatic, or a dynamic implicit scheme as in Equations (1) and (2), respectively.

FIG. 1 shows an example 100 of a system for simulating deformations of nonlinear elastic bodies in accordance with some embodiments of the disclosed subject matter. As shown in FIG. 1, model data 102 representing an elastic solid can be stored using memory 104, which can be volatile memory (e.g., RAM) and/or non-volatile storage, such as a hard drive, a solid state drive, flash, etc., with sufficient capacity to store model data 102. In some embodiments, model data 102 can include any suitable data that can be used to render a model of an elastic solid and/or simulate a reaction of the elastic solid to a deformation (e.g., caused by a collision with a kinematic solid). In some embodiments, such model data can represent any suitable elastic solid, such as a model of a human, a model of a thin volumetric sheet, etc. In some embodiments, the model data can include data related to the material properties associated with various portions of the model, metadata related to the model, color and/or texture data that can be used when rendering the model, etc. Additionally, in some embodiments, the model data can include a constitutive relation that approximates how displacement of the material(s) of the model is related to forces generated in that material(s). In some embodiments, the model data can include information subdividing the model into cells. For example, the model can include information associating cells to particular portions of the model data, and properties of the cells (e.g., a stiffness value in connection with each of three nodal degrees of freedom for each of six nodes corresponding to the cell, for a cubical cell).

In some embodiments, system 100 can include a central processing unit (CPU) 106 with cache memory 108. In some embodiments, CPU 106 can access information in cache memory 108 without using a bus 110 over which CPU 106 communicates with other hardware, such as memory 104, a GPU 112, etc. In some embodiments, CPU 106 can coordinate operation of at least a portion of system 100, such as by executing an operating system, accessing memory 104, calculating positions of one or more portions of a model, etc. Note that CPU 106 can include any suitable hardware processor or combination of processors, In some embodiments, system 100 can include a graphics processing unit (GPU) 112 that can be configured to render graphics to be presented by a display 116. For example, GPU 112 can receive at least a portion of model data 102, and can use the model data to render the elastic solid represented by the model for presentation using display 116. In such an example, positions of the various portions of the model can be calculated by CPU 106, and passed to GPU 112. Display 116 can be any suitable type of display or combination of displays. For example, display 116 can be a touchscreen, a flat panel display (e.g., a television, a computer monitor, etc.), a projector, etc. As another example, display 116 can be one or more presentation devices (e.g., an LCD display, an OLED display, an AMOLED display, etc.) integrated into a head mounted display (HMD) (or other wearable display device) that can provide a virtual reality and/or augmented reality experience to a user In some embodiments, GPU 112 can output image data to display 116 over a connection 118. In some embodiments, connection 118 can be any suitable connection that can communicate image data from GPU 112 to display 116. For example, connection 118 can be an internal bus connecting GPU 112 to an internal display (e.g., where display 116 is part of a head mounted display, smartphone, tablet computer, etc.). As another example, connection 118 can be a connection to an external display using a cable (e.g., HDMI, Display Port, DVI, etc.), a wireless link, etc. Additionally or alternatively, CPU 106 can output image data to display 116 over a connection 120. In some embodiments, connection 120 can be any suitable connection that can communicate image data from CPU 106 to display 116. For example, connection 120 can be an internal bus connecting CPU 106 to an internal display (e.g., where display 116 is part of a head mounted display, smartphone, tablet computer, etc.). As another example, connection 120 can be a connection to an external display using a cable (e.g., HDMI, Display Port, DVI, etc.), a wireless link, etc.

FIG. 2 shows an example of a model in accordance with some embodiments of the disclosed subject matter. As shown in FIG. 2, a wire mesh 202 representation of a model of a human posed quasistically by a skeleton with soft spring constants, which can be represented by 256 thousand cells aggregated into macroblocks as shown in a macroblock representation 204. By aggregating the cells into macroblocks, the system can be evaluated using degrees of freedom along the macroblock interfaces as shown in 206.

Figure 3:
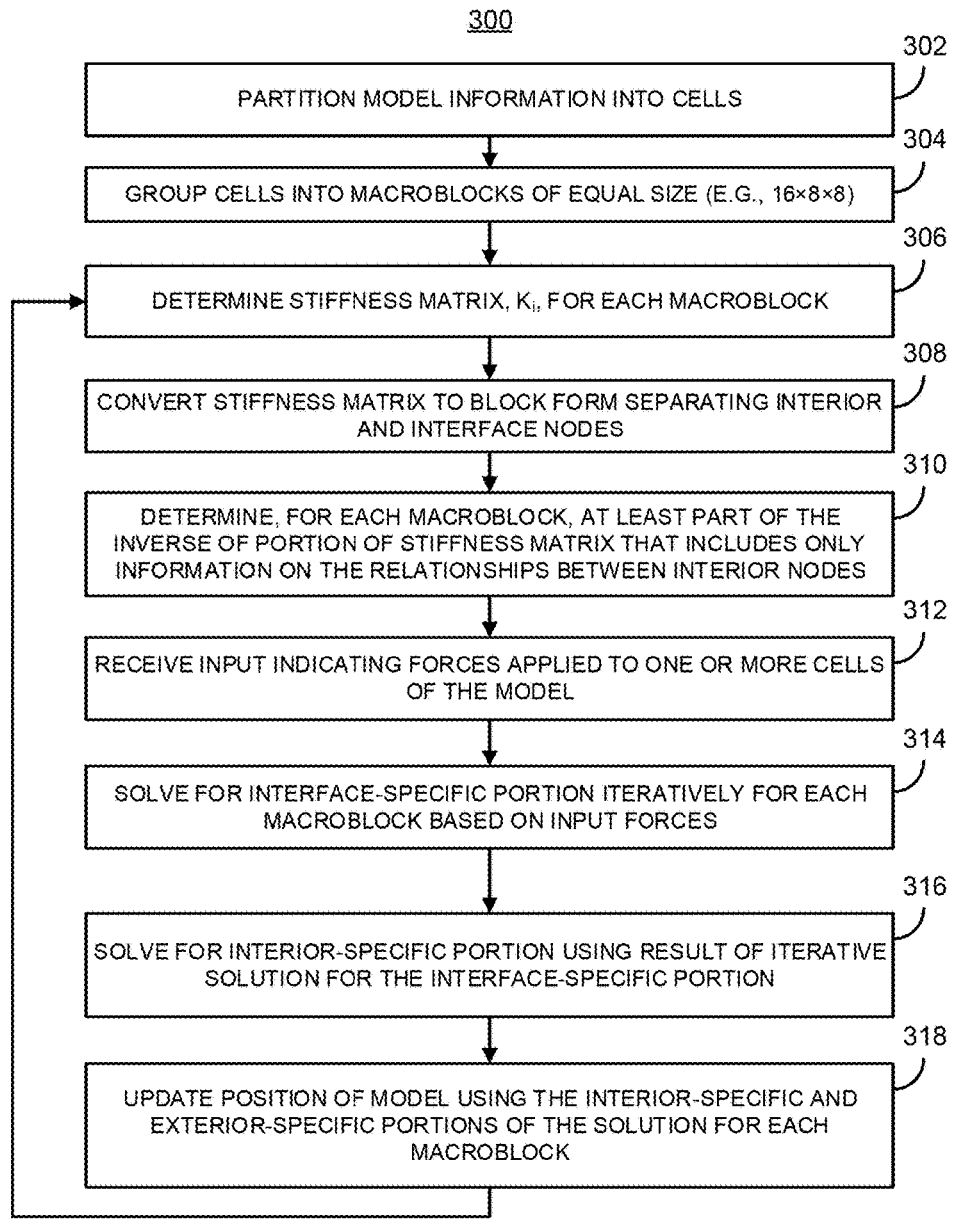
FIG. 3 shows an example of a process for simulating deformations of a nonlinear elastic body in accordance with some embodiments of the disclosed subject matter.

FIG. 3 shows an example 300 of a process for simulating deformations of a nonlinear elastic body in accordance with some embodiments of the disclosed subject matter. As shown in FIG. 3, process 300 can start at 302 by partitioning model information into cells using any suitable technique or combination of techniques. In some embodiments, each cell can represent a discrete portion of the model, and can be associated with properties that can represent how deformations to various degrees of freedom of the cell react to an applied force and/or force generated by deformation to generate forces at those degrees of freedom. For example, each face of a cell can be associated with one or more properties that can indicate the resistance of that face of the cell to deformation (i.e., the stiffness of the cell). Additionally or alternatively, in some embodiments, each node between cells can be associated with one or more properties that can indicate how the interface between the cells (i.e., the node) reacts to an applied force and/or force generated by deformation. Each node, for example, can be associated with three displacement degrees of freedom, and the properties can represent how the node reacts to displacements along each of the displacement degrees of freedom of the node. In some embodiments, the one or more properties of a face, node, etc., can indicate what forces are generated at a particular degree of freedom in response to displacement, applied forces, etc., to that degree of freedom. In some embodiments, the model data (e.g., model data 102) as stored in memory (e.g., prior to being accessed by CPU 106) can be partitioned into cells and/or can be associated with metadata describing cells into which the model can be partitioned.

In some embodiments, the cells can be partitioned using a hexahedral finite element discretization of corotated linear elasticity, with standard adjustments for robust simulation in the presence of inverted elements (e.g., as described in Irving et al. "Invertible Finite Elements for Robust Simulation of Large Deformation," SCA 2004, The Eurographics Association, which is hereby incorporated by reference herein in its entirety.) As a direct solver is used at the macroblock level (as described below), in some embodiments, the strain energy in the model can be incorporated using the eight Gauss quadrature points for each hexahedron (e.g., as opposed to the one-point quadrature scheme that is often used). In such embodiments, the more accurate quadrature scheme may not require explicit stabilization, and does not add extra computing resources other than a modest increase in the matrix construction cost.

At 304, process 300 can group the cells into equal sized blocks (i.e., macroblocks) of any suitable size. In some embodiments, process 300 can aggregate the active grid cells of the model into macroblocks, which can each represent a grid-aligned rectangular cluster of a predetermined size (e.g., as described below in connection with FIG. 4) from the model. In some embodiments, process 300 can group the cells starting from any suitable starting point (e.g., a midpoint of the model), and each macroblock can include any suitable number of cells. In some embodiments, macroblocks with dimensions of 16×8×8 grid cells can be used, although the mechanisms described herein in connection with Equations (3)-(7) are generally independent of the macroblock size.

In some embodiments, each macroblock $B_i$ of the model can include up to 16×8×8=1024 grid cells $C_{i_1}, C_{i_2}, \ldots, C_{i_M}$. Note that in some cases the maximum number of constituent cells may not be reached. For example, if the macroblock overlaps with the boundary of the modeled elastic object, or if "gaps" or voids empty of grid cells are present within the modeled elastic object's extent. Macroblocks of maximum size 16×8×8 can correspond to up to 17×9×9 nodal degrees of freedom within or on the boundary of the region represented by macroblock $B_i$. As many as 15×7×7 of these nodal degrees of freedom are entirely within the interior of macroblock $B_i$ and do not touch any other macroblock, while the remaining nodes on the boundary of $B_i$ are potentially shared by neighboring macroblocks. Note that, in some embodiments, "empty" cells that fall outside of the model, but within a macroblock can be considered to have interior nodes with each other and with other cells of the same macroblock, and exterior nodes that are potentially shared with cells of a neighboring block (which may also be "empty," or may correspond to a cell within the model). A node between two cells included in macroblock $B_i$ set is sometimes referred to herein as an interior node, and the set of interior nodes of macroblock $B_i$ can be represented as $I_i$. A node that is potentially shared with a cell in another macroblock is sometimes referred to herein as an interface node (as these reside at the interface between macroblocks), and the set of interface nodes of macroblock $B_i$ can be represented as $\Gamma_i$. Across the entire model, all sets $I_i$ are disjoint, and the union of these sets can be referred to as $I = \cup I_i$. By contrast, the interface sets $\Gamma_i$ do overlap with one another to an extent, and the union of these interface sets can be referred to as $\Gamma = \Gamma_i$. For large enough models, around 72% of grid nodes are expected to lie within the collection of interior nodes I, while approximately 28% of grid nodes are expected to be within the collection of interface nodes $\Gamma$, for the macroblock size of 16×8×8. In some embodiments, the model data (e.g., model data 102) as stored in memory (e.g., prior to being accessed by CPU 106) can be aggregated into macroblocks and/or can be associated with metadata describing macroblocks into which the model data.

At 306, process 300 can calculate a stiffness matrices ($K_i$) for each of the various macroblocks, which can be combined to form a stiffness matrix (K) that can represent the entire model. In some embodiments, the stiffness matrix (or matrices) can be calculated using any suitable technique or combination of techniques. This stiffness matrix can be used in a representation of the linear system Kx=f, which can be replaced with an equivalent system which only includes the interface nodes in $\Gamma$ as unknowns. As described below, the equivalent system can potentially be solved more efficiently than the original linear system (e.g., through a combination of a direct solver and an iterative solver). Note that, $K_i$ can represent the stiffness matrix for a particular Newton iteration, and may change in a next Newton iteration based on solutions determined by the current Newton iteration. Additionally, in some embodiments, for a first Newton iteration an undeformed or rest configuration can be used with no displacement.

At 308, process 300 can replace the linear system Kx=f with an equivalent system by rewriting K in block form, by separating interior and interface variables as follows:

$$\begin{pmatrix} K_{II} & K_{I\Gamma} \\ K_{\Gamma I} & K_{\Gamma\Gamma} \end{pmatrix} \begin{pmatrix} x_I \\ x_\Gamma \end{pmatrix} = \begin{pmatrix} f_I \\ f_\Gamma \end{pmatrix},$$

where $K_{II}$ represents a stiffness matrix corresponding to nodes between interior nodes, $K_{I\Gamma}$ represents a stiffness matrix corresponding to nodes between interior nodes and interface nodes, $K_{\Gamma I}$ represents a stiffness matrix corresponding to the nodes between interface nodes and interior nodes (and is a transpose of $K_{I\Gamma}$), and $K_{\Gamma\Gamma}$ represents a stiffness matrix corresponding to nodes between interface nodes, $x_I$ and $x_\Gamma$ representing (generally unknown) displacement vectors of the interior nodes I and the exterior nodes $\Gamma$, and $f_I$ and $f_\Gamma$ representing forces applied at the interior nodes I and the exterior nodes $\Gamma$. Using block Gauss elimination, this system can be converted to the following equivalent block-triangular form $$\begin{pmatrix} K_{II} & K_{I\Gamma} \\ 0 & K_{\Gamma\Gamma} - K_{\Gamma I} K_{II}^{-1} K_{I\Gamma} \end{pmatrix} \begin{pmatrix} x_I \\ x_\Gamma \end{pmatrix} = \begin{pmatrix} f_I \\ f_\Gamma - K_{\Gamma I} K_{II}^{-1} f_I \end{pmatrix}. \quad (3)$$

At 310, process 300 can calculate the inversion of $K_{II}$ for each macroblock to determine $K_{II}^{-1}$ using any suitable technique or combination of techniques. Due to the fact that there is no direct coupling (in K) between interior variables of neighboring macroblocks, $K_{II}$ is a block diagonal matrix that includes decoupled diagonal components for each set of interior variables of each macroblock. Accordingly, multi-threading can be used to invert the interior of each macroblock in a parallel and independent fashion. For example, within each macroblock, an aggressive SIMD-optimized direct solver described below in connection with FIG. 4 can be used to perform the inversion exactly and relatively efficiently as compared to other commonplace techniques for finding the inverse of $K_{II}$. Techniques for calculating $K_{II}^{-1}$ relatively efficiently are described below in connection with FIG. 4.

At 312, process 300 can receive input indicating forces (f) that are being applied to one or more cells of the model, which can be used to determine the displacement of the cells in the model caused by the forces. In some embodiments, the input forces can correspond to any suitable action, such as a collision with one or more a kinematic objects. As described below in connection with 318, at least a portion of the input can be represented as a vector $p_\Gamma$.

In some embodiments, an implicit representation for colliding bodies can be used to facilitate fast detection of collision events between a kinematic object and embedded collision proxies on the surface of the model. In some embodiments, when such an event occurs, a zero rest length penalty spring constraint can be instantiated connecting the offending point on the embedded surface to the nearest point on the surface of the collision object (e.g., a kinematic sphere).

At 314, process 300 can solve for the interface-specific portion of Equation (3) iteratively for each macroblock. For example, using Equation (3), the system Kx=f can be solved to calculate the displacement x by computing an interface-specific right hand side, from the bottom block of the right hand side of the system in Equation (3):

$$\hat{f}_\Gamma = f_\Gamma - K_{\Gamma I} K_{II}^{-1} f_I, \quad (4)$$

An interface-specific system $\hat{K} x_\Gamma = \hat{f}_\Gamma$ can then be solved to compute the values $x_\Gamma$ of all interface nodes. In some embodiments, initial values of x for a first iteration at 314 can be the position/displacement values determined by a previous Newton iteration. Additionally, in some embodiments, during a first Newton iteration, initial values of x for a first iteration at 314 can be the rest positions determined from the model data. Note that the matrix of the system $$\hat{K} = K_{\Gamma\Gamma} - K_{\Gamma I} K_{II}^{-1} K_{I\Gamma}, \quad (5)$$

is the Schur complement of the symmetric positive definite matrix $K_{\Gamma\Gamma}$ in the original block form of matrix K (prior to the block Gauss elimination), and is therefore symmetric and positive definite in its own right. This interface-specific system $\hat{K} x_\Gamma = \hat{f}_\Gamma$, which only involves interface degrees of freedom (e.g., rather than the degrees of freedom of all nodes in the model), can be solved for $x_\Gamma$ using Conjugate Gradients.

At 316, process 300 can solve for the interior-specific portions using the iterative solution for the interface-specific portion. The values $x_I$ can then be found by solving for the interior nodal variables from the top block of the system of Equation (3) as:

$$x_I = K_{II}^{-1}(f_I - K_{I\Gamma} x_\Gamma), \quad (6)$$

In order to reproduce the exact solution of Kx=f, the interface problem $\hat{K} x_\Gamma = \hat{f}_\Gamma$ would need to be solved exactly. However, given that this solution is used as part of an iterative Newton-method update, the Conjugate Gradients solver can generally be stopped for the interface system short of full convergence without adverse consequences. Note that the solving this interface problem typically requires significantly fewer Conjugate Gradient iterations to produce relatively high quality results (e.g., a result relatively close to the fully converged solution) than an a similar Krylov method applied to the original linear system Kx=f. Further, the per-iteration cost of CG on the interface problem can be made comparable to the per-iteration cost of performing an similar CG iteration in solving the original linear system (e.g., by reducing the memory footprint of the inverse $K_{II}^{-1}$), which can result in a significant net performance gain.

Note that the most performance-sensitive components of the solutions to solve for the values $x_\Gamma$ and $x_I$ are the inversion of $K_{II}$ and multiplication with the inverse $K_{II}^{-1}$ of the matrix block corresponding to variables interior to macroblocks. By contrast, multiplication with $K_{I\Gamma}$, $K_{\Gamma I}$ (e.g., in Equations (4) and (6)) is relatively inexpensive as the off-diagonal blocks $K_{I\Gamma}$ and $K_{\Gamma I}$ are relatively small and sparse sub-blocks of K (e.g., compared to $K_{II}^{-1}$). Additionally, $K_{I\Gamma}$ and $K_{\Gamma I}$ are used in only two matrix-vector multiplications for an entire Newton iteration in Equations (4) and (6). Accordingly, $K_{I\Gamma}$ and $K_{\Gamma I}$ can be stored in sparse format, and multiplication of these matrices with vectors can be parallelized (e.g., via SIMD within macroblocks and multithreading across blocks).

At 318, process 300 can calculate updated positions (i.e., displacements) of the model being simulated that caused by the input forces based on the interface-specific portion determined at 314 and the interior-specific portion determined at 316. In some embodiments, the Conjugate Gradients method can be performed without constructing $\hat{K}$. The interface matrix $\hat{K}$, being a Schur complement, is significantly denser than the original block form of matrix K (prior to the block Gauss elimination). For example, any two nodal variables on the interface of the same macroblock are coupled together. However, the Conjugate Gradients method does not need this matrix to be explicitly constructed. Instead, the Conjugate Gradients method can compute matrix-vector products of the form:

$$s_\Gamma = \hat{K} p_\Gamma = (K_{\Gamma\Gamma} - K_{\Gamma I} K_{II}^{-1} K_{I\Gamma}) p_\Gamma$$

for any given input vector $p_\Gamma$, which may, for example, correspond to forces applied to interface nodes of the model. Further, such products can be calculated on a per-macroblock basis. For example, by first computing the restriction of $p_\Gamma$ to the boundary $\Gamma_i$ of each macroblock $B_i$, which can be denoted by $p_{\Gamma_i}$, a partial contribution to the matrix-vector product can be calculated as $$s_{\Gamma_i} = \hat{K}_i p_{\Gamma_i} = (K_{\Gamma_i \Gamma_i} - K_{\Gamma_i I_i} K_{I_i I_i}^{-1} K_{I_i \Gamma_i}) p_{\Gamma_i} \quad (7)$$

As described below in connection with FIGS. 4, 5A and 5B, the expression in Equation (7) can be efficiently evaluated by, for example, reordering the matrix based on subdivisions of the macroblock. The contributions of all macroblocks $s_{\Gamma_i}$ can be computed in parallel (e.g., via multithreading), and can be reduced together in a final summation to produce global result $s_\Gamma$.

Note that the macroblock-local Schur complement $\hat{K}_i$, represented in Equation (7), in a similar fashion in which an elemental stiffness matrix maps nodal displacements to nodal force differentials for a tetrahedral or hexahedral element of a model (e.g., a cell of the model), the macroblock stiffness matrix $\hat{K}_i$ can directly map displacements on the boundary of a macroblock to forces on the same boundary nodes of the macroblock, under the assumption that all interior nodes are functionally constrained to their exact solution subject to the boundary displacement values.

In some embodiments, a model that is being simulated can be deformed as a result of specific lattice nodes animated as kinematic Dirichlet boundary conditions. In order to incorporate Dirichlet boundary conditions in the interior of a macroblock, the equation associated with any such node can be replaced with an explicit Dirichlet condition $\delta x_i = 0$. In such embodiments, the value can be set to zero without loss of generality, as Equation (1) is solved for position corrections, which are zero for constraint nodes that have been already moved to their target locations. Symmetry of the overall matrix can be maintained by zeroing out entries involving the Dirichlet node in the stencil of the elasticity operator of any neighboring node. This can be set to zero safely, as the Dirichlet value is zero for the correction $\delta x_i$. Similarly, any nodes in a macroblock that are exterior to the simulated model can be treated as zero-Dirichlet conditions, to maintain a constant matrix structure for all macroblocks.

FIGS. 4A-4F show an example of subdividing a macroblock into smaller sets of nodes in accordance with some embodiments of the disclosed subject matter. As described above in connection with FIG. 3, inverting $K_{II_i}$ for each macroblock is a costly (e.g., in computing resources and/or memory accesses). However, in some embodiments, the mechanisms described herein can reduce the memory footprint used to calculate the inverse of $K_{II_i}$, for example, by aggressively leveraging instruction-level (e.g., SIMD) parallelism. For example, the data in $K_{II_i}$ can be manipulated to put the data into a particular numerical data structure that includes appropriate metadata and computational routines to compute the matrix-vector product $s_{\Gamma_i}$ of Equation (7), given the boundary values $p_{\Gamma_i}$ as input. In such an example, the data structure stores matrices $K_{\Gamma_i\Gamma_i}$, $K_{\Gamma_i I_i}$, and $K_{I_i\Gamma_i}$ explicitly in a compressed sparse format (although slight modifications may be necessary to facilitate SIMD parallelism, as described below), as these matrices are relatively compact and inexpensive to multiply with. Additionally, the data structure includes enough information to be able to multiply the interior inverse $K_{II_i}^{-1}$ with input vectors, without storing this matrix explicitly. That is, values that are not used in the multiplication can be left out of the data structure to reduce the memory footprint. Note that the description of FIGS. 4A-4F and FIGS. 5A and 5B focus on a single macroblock $B_i$, and the macroblock index i is not used for the sake of simplicity, using the symbols I and Γ to denote the individual macroblocks interior and interface nodes.

Given the sparsity and definiteness of $K_{II}$, techniques for solving for the inverse exactly, such as through the use of Cholesky factorization, under a variable reordering that makes the data sparser. Such a Cholesky factorization can take place once per Newton iteration, while forward and backward substitution passes can be used to apply the inverse in every subsequent CG iteration based on Equation (7). Note that, in some embodiments, the Cholesky factorization of $K_{II}$ can proceed after calculation of entries in the stiffness matrix K for the current Newton iteration, which can be performed in parallel for multiple macroblocks (e.g., each $K_i$ can be calculated in parallel), and after the stiffness matrix is organized in block form (e.g., prior to the block Gauss elimination). Additionally, in some embodiments, a reordered Cholesky factorization can be computed using a hierarchical alternative (derived from the coefficients of the computed factorization) to forward/backward substitution that can achieve the same result in less time by reducing the required memory footprint.

In some embodiments, the 15×7×7 interior nodes of each 16×8×8 macroblock 402 can be reordered to increase the sparsity of Cholesky factorization and create repetitive regular patterns that can facilitate parallel calculation (e.g., using matched SIMD calculations). In some embodiments, the reordering can be described as a hierarchical subdivision, as illustrated in FIGS. 4A-4F. As shown in FIG. 4A, the 15×7×7 interior region can be divided into two 7×7×7 sub-regions, separated by a 1×7×7 interface layer 404. As shown in FIG. 4B, each of the two sub-regions can be further subdivided into two 3×7×7 parts, separated by 1×7×7 interface layers 406. As shown in FIG. 4C, those 3×7×7 regions can be split into two 3×3×7 parts, separated by 3×1×7 interface 408. As shown in FIG. 4D, a last subdivision results in two 3×3×3 subdomains, on either side of a 3×3×1 interface layer 410. The resulting 3×3×3 blocks are sometimes referred to herein as subdomains, and the interface layers (sometimes referred to as connecting) regions in FIGS. 4A-4D as Level-1 through Level-4 interfaces. In some embodiments, a minimum-degree reordering for one of the 16 resulting 3×3×3 subdomains can be computed, and the reordering can be mirrored across the hierarchical interfaces to enumerate the nodes of all remaining subdomains. In some embodiments, mirroring can create a repetitive pattern in the Cholesky factors, which can facilitate parallel processing (e.g., using SIMD instructions). The final overall reordering can be formed by assembling a tree of this hierarchical subdivision (with interfaces on parent nodes, and the regions they separate as their children), and computing a reverse breadth-first tree traversal.

Figure 5B:
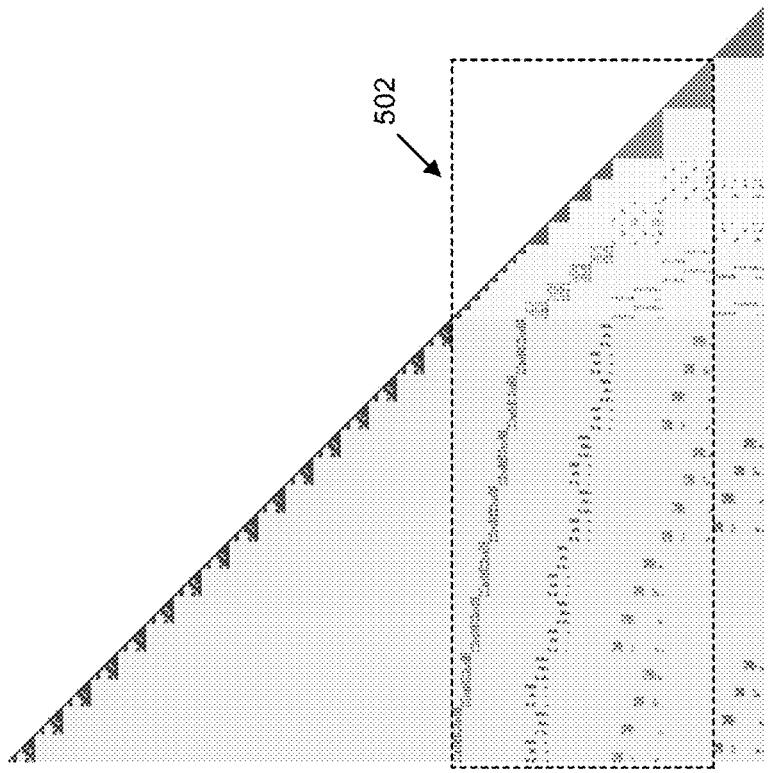
FIGS. 5A-5B show a sparsity pattern that can be generated by subdividing the macroblock as described in connection with FIG. 4.
Figure 5A:
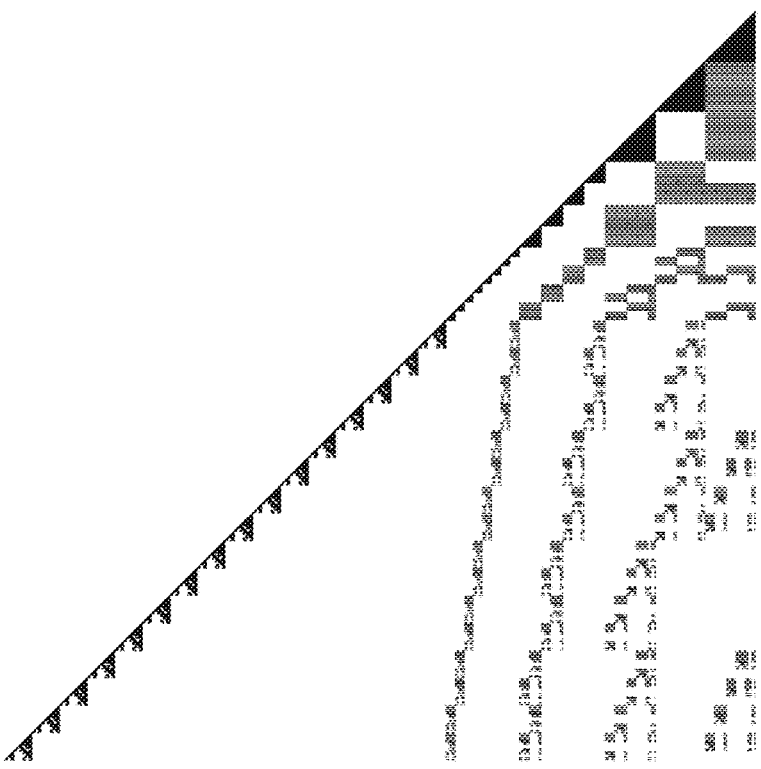

FIGS. 5A and 5B show a sparsity pattern that can be generated by subdividing the macroblock as described in connection with FIG. 4. The matrix shown in FIG. 5 includes entries that filled-in during the Cholesky process. However, forward and backward substitution on the matrix of FIG. 5A is a memory-bound operation (e.g., memory read and write operations limit are a limiting factor). As described below, an alternative to forward and backward substitution can be used to substantially reduce the amount of the matrix entries shown in FIG. 5A that are needed. Rather, the number of coefficients corresponding to the entries shown in FIG. 5B can be stored. In some embodiments, metadata for calculating the inverse matrix $K_{II}^{-1}$ can be determined from the Cholesky factorization.

In some embodiments, the first hierarchical subdivision (described above in connection with FIG. 4A), separated the 15×7×7 block of interior nodes into two 7×7×7 subregions, which are referred to below using $I_1$ and $I_2$, along with a 7×7×1 connective region referred to below using $I_c$. The matrix $K_{II}$ can be reordered to expose this partitioning, which results in the following block form:

$$\begin{pmatrix} K_{11} & 0 & K_{1c} \\ 0 & K_{22} & K_{2c} \\ K_{c1} & K_{c2} & K_{cc} \end{pmatrix}$$

The inverse of this block form matrix can be written in the following Block-LDL form:

$$\begin{pmatrix} I & 0 & -K_{11}^{-1}K_{1c} \\ 0 & I & -K_{22}^{-1}K_{2c} \\ 0 & 0 & I \end{pmatrix} \begin{pmatrix} K_{11}^{-1} & 0 & 0 \\ 0 & K_{22}^{-1} & 0 \\ 0 & 0 & C \end{pmatrix} \begin{pmatrix} I & 0 & 0 \\ 0 & I & 0 \\ -K_{c1}K_{11}^{-1} & -K_{c2}K_{22}^{-1} & I \end{pmatrix}$$

Where $C = K_{cc} - K_{c1}K_{11}^{-1}K_{1c} - K_{c2}K_{22}^{-1}K_{2c}$ is the Shur complement of $K_{cc}$. Using this formulation, solving a problem $K_{II}x_I = f_I$ is equivalent to multiplying with the factorized version of $K_{II}^{-1}$ the equation above. Other than the inverses $K_{11}^{-1}$ and $K_{22}^{-1}$, the factorization above does not incur any fill-in. Factors such as $K_{1c}$, etc. have the original sparsity found in sub-blocks of $K_{II}$. The lower-triangular Cholesky factor of the Schur complement C is the bottom-rightmost (dense) diagonal block of the matrix shown in FIG. 5B. Accordingly, multiplication with $C^{-1}$ can be performed via forward and backward substitution. The inverses of the two subregions, $K_{11}^{-1}$ and $K_{22}^{-1}$ can be applied recursively using the same decomposition and block-LDL factorization described here, by splitting each 7×7×7 into two 7×7×3 subregions and a 7×7×1 connector as before. The recurrence can be unfolded until each of the (sixteen) 3×3×3 subdomains shown in FIGS. 4E and 4F. The Cholesky factors of those sixteen blocks are the top-sixteen (sparse) diagonal blocks on the top-left of the Cholesky factorization in FIG. 5B, which can be readily inverted without recursion.

The Cholesky factors of the Schur complement matrices (C) that appear in deeper levels of this hierarchical solution scheme can be similarly determined from the (dense) diagonal blocks of the overall Cholesky factorization (shown within box 502). At the final level, the inverses of the matrix blocks corresponding to the sixteen 3×3×3 subdomains themselves can be calculated. For those blocks, the sparse Cholesky factorization, as seen in the top-sixteen diagonal blocks in FIG. 5B can be used to solve for the inversions using standard forward and backward substitution.

Although the recursive solution described in connection with FIGS. 4A-4F, 5A and 5B involves additional computation, the stock Cholesky forward and backward substitution are memory-bound by a wide margin and the recursive solution described in connection with FIGS. 4A-4F, 5A and 5B can afford to execute a significantly larger amount of arithmetic operations, while still being (barely, this time) bound by the time required to stream the requisite matrix coefficients from memory into cache. In some embodiments, the entire working set of the recursive solver can be less than 800 KB per macroblock, which can allow all subsequent memory accesses to occur exclusively in cache for every CPU core handling an individual macroblock. Note that, although the original reordered Cholesky factorization produces additional fill-in on the matrix entries that are represented in FIG. 5A, but not in FIG. 5B, the recursive substitution techniques described above uses a significantly sparser subset of entries (i.e., the entries represented in FIG. 5B), requiring about 27% of the entries and 15% of the storage footprint of the full, filled-in Cholesky (accounting for row/column indices of structurally sparse blocks).

In some embodiments, the sparse matrix data represented in FIG. 5B includes a significant amount of regular and repetitive sparsity patterns that can facilitate computation using SIMD instructions. For example, the entries corresponding to the sixteen sparse Cholesky factors corresponding to the interiors of the 3×3×3 subdomains, which are represented as being above box 502 in FIG. 5B, dense Cholesky factors of Schur complements at deeper levels running diagonally from the factors corresponding to the sixteen 3×3×3 subdomains (including 15 densely populated triangular regions), and sparse submatrices on the block lower-triangular part of the matrix, corresponding to entries of the original stiffness matrix that correspond to an interface layer at a given level of the hierarchy and nodes on the two subregions that the interface layer separates.

In some embodiments, the regularity of the data can be used to facilitate vectorization of the data. For example, sparse forward and backward substitution on all sixteen 3×3×3 subdomains can be done in tandem, with 16-way SIMD parallelism (e.g., using two 8-wide Advanced Vector Extensions (AVX) instructions). Repetitive sparsity patterns in the lower-triangular part of the matrix of FIG. 5B can be used in vectorized matrix-vector multiplication operations. The dense nature of the blocks along the lower part of the block-diagonal can facilitate fine-grain vectorization using any suitable technique or combination of techniques. Furthermore, matrix operations that connect the 15×7×7 interior node set with the boundary of the macroblock, as the multiplication with matrices $K_{\Gamma_i\Gamma_i}$, $K_{\Gamma_iJ_i}$ and $K_{J_i\Gamma_i}$ described in connection with FIGS. 3 and 4A-4F, can be vectorized by splitting up such matrices in parts that correspond to the sixteen 3×3×3 macroblocks at the interior of the macroblock boundary. In some embodiments, about 96% of the requisite computations can accommodate 16-wide SIMD parallelism, and the majority of the remaining operations can potentially be performed using at least 8-wide SIMD parallelism. In some embodiments, vectorization can take advantage of AVX compiler intrinsics to potentially perform the computations described herein more efficiently.

Macroblocks of dimension 16×8×8 are generally described herein, which in some embodiments can facilitate using at least 16-way SIMD-based parallelism. The working set size associated with macroblocks of that size is approximately 800 KB, such that the entire macroblock solver (for at least a single macroblock) can fit entirely in cache, even if all cores of a typical modern Xeon processor are processing independent macroblocks, in parallel. Although macroblocks of dimension 16×8×8 are generally described herein, macroblocks with other dimensions can be used. For example, a larger macroblock size of 16×16×8 would allow the dimensionality of the interface to be further reduced, but the increment in the working set would be relatively large, due to the size of the next-level interface layer (which would be 15×1×7) which may yield an unattractively large dense Schur complement matrix for that interface layer.

Table 1 shows runtime details for individual solver components as described above in connection with, for example, FIGS. 3 to 5B. The first two columns correspond to a human model (e.g., as depicted in FIG. 2) and a model of anthropomorphic armadillo, and have been processed using a macroblock solver as described above in connection with FIGS. 3 to 5B. In addition, simulation of the human model using a highly optimized and parallelized matrix-free implementation of unpreconditioned Conjugate Gradients across two discretization alternatives: (a) a one-point quadrature scheme, with explicit stabilization, represented by the third column and (b) an 8-point quadrature scheme (e.g., as used in the macroblock solver), represented by the fourth column. Note that, as described above, the quadrature scheme may not significantly affect the time to compute a solution using techniques described herein after the matrix has been constructed. In the particular example implementation used to generate the results in Table 1 the construction cost is included in the Newton iteration runtimes, and was less than 10% of the overall runtime. Note that, in spite of the up-front factorization cost of techniques described herein, it typically stays within a factor of 2-3× the cost of the single quadrature point CG scheme, for the same number of iterations. However, the effect of as few as ten iterations using techniques described herein can determine a solution commensurate with 5-10 times more iterations of a stock CG method. Note that if the more accurate quadrature scheme is employed (Column 4 of Table 1), a solved using techniques described herein can outperform the CG method even on a per-iteration basis.

TABLE 1

| | Human model | Armadillo model | Human model | Human model |
|---|---|---|---|---|
| Solver | Macroblock | Macroblock | CG | CG |
| Active Cells | 286K | 24K | 286K | 286K |
| Macroblocks | 642 | 95 | N/A | N/A |
| Interface-Multiply | 27.6 ms (17 GB/s) | 4.36 ms (16 GB/s) | N/A | N/A |
| CG Iteration | 33.3 ms | 5.22 ms | 18.8 ms | 88.3 ms |
| Factorization | 291 ms | 88.0 ms | N/A | N/A |
| Newton Iteration | | | | |
| 10 CG | 791 ms | 166 ms | 269 ms | 958 ms |
| 20 CG | 1.29 s | 244 ms | 462 ms | 1.84 s |
| 50 CG | 2.79 s | 479 ms | 1.07 s | 4.47 s |

As another example, an alternative to the techniques described in connection with FIGS. 4A-4F, a stock Cholesky factorization can be used to directly computed and applied per macroblock. Using the PARDISO library to use such a factorization yielded a factorization cost of 748 ms (291 ms using techniques described in connection with FIGS. 4A-4F) and a solve time of 93 ms via forward/backward substitution (20.9 ms using techniques described in connection with FIGS. 4A-4F, which is included in the Interface-Multiply cost in Table 1). Reduced memory demands resulted in at least a portion of the difference in solve times. Faster factorization time is due at least in part to intrinsic knowledge about the constant sparsity pattern of each block, which can facilitate vectoriziation over multiple blocks without duplicating the data that captures their sparsity patterns.

As yet another example, using a direct (complete) Cholesky solve at each Newton step, via PARDISO, the resulting Newton iteration cost was 31.8 s (more than three times the cost using techniques described herein), which would require for 250 CG iterations (9.36 s) and near-perfect convergence.

As still another example, using Incomplete Cholesky Preconditioned Conjugate Gradient (ICPCG), may require less CG iterations for comparable convergence. However, ICPCG being a serial algorithm, the total time required to simulate a collision is significantly higher. ICPCG required 7.23 s to factorize the preconditioner (291 ms using techniques described in connection with FIGS. 4A-4F) and 422 ms (33.3 ms using techniques described herein) for each CG iteration.

As a further example, using Block Jacobi PCG, an alternative to ICPCG that can be executed in parallel to compute a Block Jacobi Preconditioner, with block sizes comparable to the macroblocks described herein, matrix entries that straddle blocks were discarded, and a standard Cholesky factorization of the resulting block-diagonal matrix computed via PARDISO. Convergence of Block Jacobi PCG was generally comparable to the techniques described herein, but required 1.24 s for factorization (291 ms using techniques described in connection with FIGS. 4A-4F) and yielded a CG iteration cost of 183 ms (33.3 ms using techniques described herein).

Note that, although the mechanisms described herein are described in connection with simulating behavior of a model, the techniques described herein can be used in connection with other applications. For example, the mechanisms described herein can be used in connection with modeling the behavior of heterogeneous elastic materials intended for additive manufacture (e.g., 3D printing), analyzing the macroscopic behavior of a structure, finite element analyses, static analysis of engineering structures, grid-based discretizations of elliptic Partial Differential Equations, among others.

In some embodiments, any suitable computer readable media can be used for storing instructions for performing the functions and/or processes described herein. For example, in some embodiments, computer readable media can be transitory or non-transitory. For example, non-transitory computer readable media can include media such as magnetic media (such as hard disks, floppy disks, etc.), optical media (such as compact discs, digital video discs, Blu-ray discs, etc.), semiconductor media (such as RAM, Flash memory, electrically programmable read only memory (EPROM), electrically erasable programmable read only memory (EEPROM), etc.), any suitable media that is not fleeting or devoid of any semblance of permanence during transmission, and/or any suitable tangible media. As another example, transitory computer readable media can include signals on networks, in wires, conductors, optical fibers, circuits, or any suitable media that is fleeting and devoid of any semblance of permanence during transmission, and/or any suitable intangible media.

It should be noted that, as used herein, the term mechanism can encompass hardware, software, firmware, or any suitable combination thereof.

It should be understood that the above described steps of the processes described in connection with FIGS. 3, 4A-4F, and 5A-5B can be executed or performed in any order or sequence not limited to the order and sequence shown and described in connection with the figures. Also, some of the above steps of the processes of FIGS. 3, 4A-4F, and 5A-5B can be executed or performed substantially simultaneously where appropriate or in parallel to reduce latency and processing times.

Although the invention has been described and illustrated in the foregoing illustrative embodiments, it is understood that the present disclosure has been made only by way of example, and that numerous changes in the details of implementation of the invention can be made without departing from the spirit and scope of the invention, which is limited only by the claims that follow. Features of the disclosed embodiments can be combined and rearranged in various ways.

What is claimed is:

1. A method for simulating deformation of an elastic body, the method comprising:
    determining, using a hardware processor, for each of a plurality of macroblocks $B_i$, including a first macroblock $B_1$, a stiffness matrix $K_i$ corresponding to at least a portion of a model of a non-linear elastic solid that is partitioned into a plurality of cells, wherein entries in the stiffness matrix $K_i$ correspond to nodes associated with cells of the macroblock $B_i$;

converting, for the first macroblock $B_1$, the stiffness matrix $K_1$ into block form to include a submatrix $K_{I_1I_1}$, where the subscript $I_1I_1$ indicates that the submatrix $K_{I_1I_1}$ includes entries in which both nodes associated with the entry are between cells of the first macroblock $B_1$;

determining, for the first macroblock $B_1$, at least a portion of an inverse matrix $K_{I_1I_1}^{-1}$ of the submatrix $K_{I_1I_1}$;

receiving input data corresponding to force applied to one or more nodes of the plurality of cells of the model;

determining, for the first macroblock $B_1$, displacements of nodes that are on the exterior of the first macroblock $B_1$ based at least in part on the input data and the portion of the inverse matrix $K_{I_1I_1}^{-1}$;

determining, for the first macroblock $B_1$, displacements of nodes that are interior to the first macroblock $B_1$ based at least in part on the input data and the displacements of nodes that are on the exterior of the first macroblock $B_1$;

determining updated positions of the cells of the model based at least in part on the displacements of nodes that are on the exterior of the macroblocks; and causing the model to be presented on a display device using the updated positions.

2. The method of claim 1, wherein each of the plurality of macroblocks $B_i$ has 16×8×8 grid cells and comprise 15×7×7 internal nodes, wherein each macroblock is associated with a submatrix $K_{I_iI_i}$ that only includes entries for nodes between two cells of macroblock $B_i$.

3. The method of claim 2, wherein determining at least the portion of the inverse matrix $K_{I_1I_1}^{-1}$ further comprises:

partitioning the 15×7×7 internal nodes of the first macroblock $B_1$ into sixteen 3×3×3 subdomains and five interface layers, wherein a first interface layer represents a 1×7×7 layer of nodes that separates the 15×7×7 internal nodes into a first 7×7×7 subdomain and a second 7×7×7 subdomain;

generating a block form of the submatrix $K_{I_1I_1}$ by reordering the submatrix $K_{I_1I_1}$ into a first submatrix $K_{11}$ corresponding to entries representing nodes in the first 7×7×7 subdomain, a second submatrix $K_{22}$ corresponding to entries representing nodes in the second 7×7×7 subdomain, a third submatrix $K_{cc}$ corresponding to entries representing nodes in the first interface layer, a submatrix $K_{1c}$ corresponding to entries representing nodes in the first 7×7×7 subdomain and the first interface layer, a submatrix $K_{2c}$ corresponding to entries between nodes in the second 7×7×7 subdomain and the first interface layer, a submatrix $K_{c1}$ corresponding to entries between nodes in the first interface layer and the first 7×7×7 subdomain, and a submatrix $K_{c2}$ corresponding to entries between nodes in the first interface layer and the second 7×7×7 subdomain;

generating at least a portion of the inverse of the block form of the submatrix $K_{I_1I_1}$ by converting the block form of the submatrix $K_{I_1I_1}$ to a block-LDL form:

$$\begin{pmatrix} I & 0 & -K_{11}^{-1}K_{1c} \\ 0 & I & -K_{22}^{-1}K_{2c} \\ 0 & 0 & I \end{pmatrix} \begin{pmatrix} K_{11}^{-1} & 0 & 0 \\ 0 & K_{22}^{-1} & 0 \\ 0 & 0 & C \end{pmatrix} \begin{pmatrix} I & 0 & 0 \\ 0 & I & 0 \\ -K_{c1}K_{11}^{-1} & -K_{c2}K_{22}^{-1} & I \end{pmatrix}$$

where C in the block-LDL form represents the Shur complement of $K_{cc}$ and is equal to $K_{cc} - K_{c1}K_{11}^{-1}K_{1c} - K_{c2}K_{22}^{-1}K_{2c}$;

determining, for each of the sixteen 3×3×3 subdomains, an inverse $K_{jj}^{-1}$ of a submatrix $K_{jj}$ corresponding to entries within that 3×3×3 subdomain, where subscript j represents which of the sixteen 3×3×3 subdomains the submatrix represents;

determining $K_{11}^{-1}$ based on each inverse $K_{jj}^{-1}$ that corresponds to a 3×3×3 subdomain included within the first subdomain;

determining $K_{22}^{-1}$ based on each inverse $K_{jj}^{-1}$ that corresponds to a 3×3×3 subdomain included within the second subdomain; and storing at least the portion of the inverse matrix $K_{I_1I_1}^{-1}$ in cache memory of the hardware processor.

4. The method of claim 3, wherein inverting each submatrix $K_{jj}$ further comprises:

determining Cholesky factors for the submatrix $K_{jj}$; and determining the inverse $K_{jj}^{-1}$ using the Cholesky factors and forward and backward substitution.

5. The method of claim 3, further comprising inverting the submatrices $K_{jj}$ corresponding to the sixteen 3×3×3 subdomains in parallel.

6. The method of claim 1, further comprising determining at least the portion of an inverse matrix $K_{I_iI_i}^{-1}$ corresponding to each of the plurality of macroblocks $B_i$, including the portion of the inverse matrix $K_{I_1I_1}^{-1}$ corresponding the first macroblock $B_1$, in parallel.

7. The method of claim 1, wherein determining displacements of nodes that are on the exterior of the first macroblock $B_1$ based at least in part on the input data and at least the portion of the inverse matrix $K_{I_1I_1}^{-1}$ further comprises using a Conjugate Gradient-based iterative solver.

8. The method of claim 1, further comprising:

determining, for each of a second plurality of macroblocks $B_i$ that each overlap a boundary of the model, a stiffness matrix $K_i$ corresponding to at least a portion of the model, wherein each macroblock of the second plurality of macroblocks includes at least one empty cell; and setting, for each of the second plurality of macroblocks, entries in the stiffness matrix $K_i$ that correspond to nodes in the macroblock that are exterior to the model to a zero-Dirichlet condition.

9. A system for simulating deformation of an elastic body, the system comprising:

memory storing a model of a non-linear elastic solid;

a display device;

a hardware processor that is coupled to the memory and the display device, and is programmed to;

determine, using a hardware processor, for each of a plurality of macroblocks $B_i$, including a first macroblock $B_1$, a stiffness matrix $K_i$ corresponding to at least a portion of the model that is partitioned into a plurality of cells, wherein entries in the stiffness matrix correspond to nodes associated with cells of the macroblock $B_i$;

convert, for for first macroblock $B_1$, the stiffness matrix $K_1$ into block form to include a submatrix $K_{I_1I_1}$, where the subscript $I_1I_1$ indicates that the submatrix $K_{I_1I_1}$ includes entries in which both nodes associated with the entry are between cells of the first macroblock $B_1$;

determining, for the first macroblock $B_1$, at least a portion of an inverse matrix $K_{I_1I_1}^{-1}$ of the submatrix $K_{I_1I_1}$;

receive input data corresponding to force applied to one or more nodes of the plurality of cells of the model;

determine, for the first macroblock $B_1$, displacements of nodes that are on the exterior of the first macroblock $B_1$ based at least in part on the input data and the portion of the inverse matrix $K_{I_1I_1}^{-1}$;

determine, for the first macroblock $B_1$, displacements of nodes that are interior to the first macroblock $B_1$ based at least in part on the input data and the displacements of nodes that are on the exterior of the first macroblock $B_1$;

determine updated positions of the cells of the model based at least in part on the displacements of nodes that are on the exterior of the macroblocks; and cause the model to be presented on the display device using the updated positions.

10. The system of claim 9, wherein each of the plurality of macroblocks $B_i$ has 16×8×8 grid cells and comprise 15×7×7 internal nodes, wherein each macroblock is associated with a submatrix $K_{I_iI_i}$ that only includes entries for nodes between two cells of macroblock $B_i$.

11. The system of claim 10, wherein the hardware processor is associated with cache memory, and is further programmed to:

partition the 15×7×7 internal nodes of the first macroblock $B_1$ into sixteen 3×3×3 subdomains and five interface layers, wherein a first interface layer represents a 1×7×7 layer of nodes that separates the 15×7×7 internal nodes into a first 7×7×7 subdomain and a second 7×7×7 subdomain;

generate a block form of the submatrix $K_{I_1I_1}$ by reordering the submatrix $K_{I_1I_1}$ into a first submatrix $K_{11}$ corresponding to entries representing nodes in the first 7×7×7 subdomain, a second submatrix $K_{22}$ corresponding to entries representing nodes in the second 7×7×7 subdomain, a third submatrix $K_{cc}$ corresponding to entries representing nodes in the first interface layer, a submatrix $K_{1c}$ corresponding to entries representing nodes in the first 7×7×7 subdomain and the first interface layer, a submatrix $K_{2c}$ corresponding to entries between nodes in the second 7×7×7 subdomain and the first interface layer, a submatrix $K_{c1}$ corresponding to entries between nodes in the first interface layer and the first 7×7×7 subdomain, and a submatrix $K_{c2}$ corresponding to entries between nodes in the first interface layer and the second 7×7×7 subdomain;

generate at least a portion of the inverse of the block form of the submatrix $K_{I_1I_1}$ by converting the block form of the submatrix $K_{I_1I_1}$ to a block-LDL form:

$$\begin{pmatrix} I & 0 & -K_{11}^{-1}K_{1c} \\ 0 & I & -K_{22}^{-1}K_{2c} \\ 0 & 0 & I \end{pmatrix} \begin{pmatrix} K_{11}^{-1} & 0 & 0 \\ 0 & K_{22}^{-1} & 0 \\ 0 & 0 & C \end{pmatrix} \begin{pmatrix} I & 0 & 0 \\ 0 & I & 0 \\ -K_{c1}K_{11}^{-1} & -K_{c2}K_{22}^{-1} & I \end{pmatrix}$$

where C in the block-LDL form represents the Shur complement of $K_{cc}$ and is equal to $K_{cc} - K_{c1}K_{11}^{-1}K_{1c} - K_{c2}K_{22}^{-1}K_{2c}$;

determine, for each of the sixteen 3×3×3 subdomains, an inverse $K_{jj}^{-1}$ of a submatrix $K_{jj}$ corresponding to entries within that 3×3×3 subdomain, where subscript j represents which of the sixteen 3×3×3 subdomains the submatrix represents;

determine $K_{11}^{-1}$ based on each inverse $K_{jj}^{-1}$ that corresponds to a 3×3×3 subdomain included within the first subdomain;

determine $K_{22}^{-1}$ based on each inverse $K_{jj}^{-1}$ that corresponds to a 3×3×3 subdomain included within the second subdomain; and store at least the portion of the inverse matrix $K_{I_1I_1}^{-1}$ in cache memory of the hardware processor.

12. The system of claim 11, wherein the hardware processor is further programmed to:

determine, for each submatrix $K_{jj}$, Cholesky factors for the submatrix $K_{jj}$; and determine, for each submatrix $K_{jj}$, the inverse $K_{jj}^{-1}$ using the Cholesky factors and forward and backward substitution.

13. The system of claim 11, wherein the hardware processor is further programmed to invert the submatrices $K_{jj}$ corresponding to the sixteen 3×3×3 subdomains in parallel using single instruction, multiple data instructions.

14. The system of claim 9, wherein the hardware processor is further programmed to determine at least the portion of an inverse matrix $K_{I_iI_i}^{-1}$ corresponding to each of the plurality of macroblocks $B_i$, including the portion of the inverse matrix $K_{I_1I_1}^{-1}$ corresponding the first macroblock $B_1$, in parallel using single instruction, multiple data instructions.

15. The system of claim 9, wherein the hardware processor is further configured to use a Conjugate Gradient-based iterative solver to determine displacements of nodes that are on the exterior of the first macroblock $B_1$.

16. The system of claim 9, wherein the hardware processor is further programmed to:

determine, for each of a second plurality of macroblocks $B_i$ that each overlap a boundary of the model, a stiffness matrix $K_i$ corresponding to at least a portion of the model, wherein each macroblock of the second plurality of macroblocks includes at least one empty cell; and set, for each of the second plurality of macroblocks, entries in the stiffness matrix $K_i$ that correspond to nodes in the macroblock that are exterior to the model to a zero-Dirichlet condition.

17. A non-transitory computer readable medium containing computer executable instructions that, when executed by a processor, cause the processor to perform a method for simulating deformation of an elastic body, the method comprising:

determining for each of a plurality of macroblocks $B_i$, including a first macroblock $B_1$, a stiffness matrix $K_i$ corresponding to at least a portion of a model of a non-linear elastic solid that is partitioned into a plurality of cells, wherein entries in the stiffness matrix $K_i$ correspond to nodes associated with cells of the macroblock $B_i$;

converting, for the first macroblock $B_1$, the stiffness matrix $K_1$ into block form to include a submatrix $K_{I_1I_1}$, where the subscript $I_1I_1$ indicates that the submatrix $K_{I_1I_1}$ includes entries in which both nodes associated with the entry are between cells of the first macroblock $B_1$;

determining, for the first macroblock $B_1$, at least a portion of an inverse matrix $K_{I_1I_1}^{-1}$ of the submatrix $K_{I_1I_1}$;

receiving input data corresponding to force applied to one or more nodes of the plurality of cells of the model;

determining, for the first macroblock $B_1$, displacements of nodes that are on the exterior of the first macroblock $B_1$ based at least in part on the input data and the portion of the inverse matrix $K_{I_1I_1}^{-1}$;

determining, for the first macroblock $B_1$, displacements of nodes that are interior to the first macroblock $B_1$ at least in part on the input data and the displacements of nodes that are on the exterior of the first macroblock $B_1$;

determining updated positions of the cells of the model based at least in part on the displacements of nodes that are on the exterior of the macroblocks; and causing the model to be presented on a display device using the updated positions.

18. The non-transitory computer readable medium of claim 17, wherein each of the plurality of macroblocks $B_i$ has 16×8×8 grid cells and comprise 15×7×7 internal nodes, wherein each macroblock is associated with a submatrix $K_{I_iI_i}$ that only includes entries for nodes between two cells of macroblock $B_i$.

19. The non-transitory computer readable medium of claim 18, wherein determining at least the portion of the inverse matrix $K_{I_1I_1}^{-1}$ further comprises:

partitioning the 15×7×7 internal nodes of the first macroblock $B_1$ into sixteen 3×3×3 subdomains and five interface layers, wherein a first interface layer represents a 1×7×7 layer of nodes is that separates the 15×7×7 internal nodes into a first 7×7×7 subdomain and a second 7×7×7 sub domain;

generating a block form of the submatrix $K_{I_1I_1}$ by reordering the submatrix $K_{I_1I_1}$ into a first submatrix $K_{11}$ corresponding to entries representing nodes in the first 7×7×7 subdomain, a second submatrix $K_{22}$ corresponding to entries representing nodes in the second 7×7×7 subdomain, a third submatrix $K_{cc}$ corresponding to entries representing nodes in the first interface layer, a submatrix $K_{1c}$ corresponding to entries representing nodes in the first 7×7×7 subdomain and the first interface layer, a submatrix $K_{2c}$ corresponding to entries between nodes in the second 7×7×7 subdomain and the first interface layer, a submatrix $K_{c1}$ corresponding to entries between nodes in the first interface layer and the first 7×7×7 subdomain, and a submatrix $K_{c2}$ corresponding to entries between nodes in the first interface layer and the second 7×7×7 subdomain;

generating at least a portion of the inverse of the block form of the submatrix $K_{I_1I_1}$ by converting the block form of the submatrix $K_{I_1I_1}$ to a block-LDL form:

$$\begin{pmatrix} I & 0 & -K_{11}^{-1}K_{1c} \\ 0 & I & -K_{22}^{-1}K_{2c} \\ 0 & 0 & I \end{pmatrix} \begin{pmatrix} K_{11}^{-1} & 0 & 0 \\ 0 & K_{22}^{-1} & 0 \\ 0 & 0 & C \end{pmatrix} \begin{pmatrix} I & 0 & 0 \\ 0 & I & 0 \\ -K_{c1}K_{11}^{-1} & -K_{c2}K_{22}^{-1} & I \end{pmatrix}$$

where C in the block-LDL form represents the Shur complement of $K_{cc}$ and is equal to $K_{cc} - K_{c1}K_{11}^{-1}K_{1c} - K_{c2}K_{22}^{-1}K_{2c}$;

determining, for each of the sixteen 3×3×3 subdomains, an inverse $K_{jj}^{-1}$ of a submatrix $K_{jj}$ corresponding to entries within that 3×3×3 subdomain, where subscript j represents which of the sixteen 3×3×3 subdomains the submatrix represents;

determining $K_{11}^{-1}$ based on each inverse $K_{jj}^{-1}$ that corresponds to a 3×3×3 subdomain included within the first subdomain;

determining $K_{22}^{-1}$ based on each inverse $K_{jj}^{-1}$ that corresponds to a 3×3×3 subdomain included within the second subdomain; and storing at least the portion of the inverse matrix $K_{I_1I_1}^{-1}$ in cache memory of the hardware processor.

20. The non-transitory computer readable medium of claim 19, wherein inverting each submatrix $K_{jj}$ further comprises:

determining Cholesky factors for the submatrix $K_{jj}$; and determining the inverse $K_{jj}^{-1}$ using the Cholesky factors and forward and backward substitution.

21. The non-transitory computer readable medium of claim 19, wherein the method further comprises inverting the submatrices $K_{jj}$ corresponding to the sixteen 3×3×3 subdomains in parallel.

22. The non-transitory computer readable medium of claim 17, wherein the method further comprises determining at least the portion of an inverse matrix $K_{I_iI_i}^{-1}$ corresponding to each of the plurality of macroblocks $B_i$, including the portion of the inverse matrix $K_{I_1I_1}^{-1}$ corresponding the first macroblock $B_1$, in parallel.

23. The non-transitory computer readable medium of claim 17, wherein determining displacements of nodes that are on the exterior of the first macroblock $B_1$ based at least in part on the input data and at least the portion of the inverse matrix $K_{I_1I_1}^{-1}$ further comprises using a Conjugate Gradient-based iterative solver.

24. The non-transitory computer readable medium of claim 17, wherein the method further comprises:

determining, for each of a second plurality of macroblocks $B_i$ that each overlap a boundary of the model, a stiffness matrix $K_i$ corresponding to at least a portion of the model, wherein each macroblock of the second plurality of macroblocks includes at least one empty cell; and setting, for each of the second plurality of macroblocks, entries in the stiffness matrix $K_i$ that correspond to nodes in the macroblock that are exterior to the model to a zero-Dirichlet condition.

* * * * *